United States Patent
Kadivar et al.

(10) Patent No.: US 8,189,348 B2
(45) Date of Patent: May 29, 2012

(54) ALIGNING BRACKET

(75) Inventors: Mohammad Reza Danesh Kadivar, Santa Clara, CA (US); Hong Huynh, Fremont, CA (US); Saeed Seyed, Los Altos Hills, CA (US); James T. Theodoras, II, San Jose, CA (US); Susheela Narasimhan, Miltpitas, CA (US)

(73) Assignee: Cisco Technology, Inc., San Jose, CA (US)

( * ) Notice: Subject to any disclaimer, the term of this patent is extended or adjusted under 35 U.S.C. 154(b) by 985 days.

(21) Appl. No.: 12/174,713

(22) Filed: Jul. 17, 2008

(65) Prior Publication Data

US 2010/0014268 A1    Jan. 21, 2010

(51) Int. Cl.
*H05K 7/14* (2006.01)
(52) U.S. Cl. .................. 361/807; 361/809; 361/810
(58) Field of Classification Search .................. 361/807, 361/809, 810, 741, 756, 802
See application file for complete search history.

(56) References Cited

U.S. PATENT DOCUMENTS

| | | | | |
|---|---|---|---|---|
| 5,691,504 A | * | 11/1997 | Sands et al. | 174/372 |
| 5,999,416 A | * | 12/1999 | McAnally et al. | 361/816 |
| 6,137,688 A | * | 10/2000 | Borkar et al. | 361/753 |
| 6,362,978 B1 | * | 3/2002 | Boe | 361/825 |
| 6,771,516 B1 | * | 8/2004 | Leman et al. | 361/825 |
| 6,822,878 B2 | * | 11/2004 | Dobbs et al. | 361/807 |
| 6,963,489 B2 | * | 11/2005 | Askeland et al. | 361/679.51 |
| 7,072,176 B2 | * | 7/2006 | Lin et al. | 361/679.02 |
| 7,106,601 B2 | * | 9/2006 | Chen et al. | 361/801 |
| 7,110,264 B2 | * | 9/2006 | Chen et al. | 361/801 |
| 2007/0086168 A1 | * | 4/2007 | Khanna et al. | 361/719 |

* cited by examiner

*Primary Examiner* — Dameon Levi

(57) ABSTRACT

In one embodiment, the present disclosure refers to an apparatus comprising a bracket having a base configured to receive and hold a first electronic element. The bracket comprises at least one flange extending from the base and at least one guide acting to align the bracket and first electronic element with a second electronic element. The bracket also comprises at least one fastener aligned with the at least one guide and acting to engage and hold the second electronic element.

20 Claims, 4 Drawing Sheets

ALIGNING BRACKET

TECHNICAL FIELD OF THE INVENTION

The present disclosure relates generally to a bracket. In particular, although not exclusively, the present disclosure relates to a bracket that secures and aligns electronic elements.

BACKGROUND

Many electronic products have multiple printed circuit boards. Because of physical constraints, it is often difficult to correctly align the mating connectors on each printed circuit board during assembly. If aligned incorrectly, the leads on the connectors can be damaged and cause faults in the electronic product. Often damaged connectors require replacing, which places additional cost and inconvenience on manufacturers of electronic products. Manufacturers often rely on visual alignment as the solitary means of aligning printed circuit boards.

OVERVIEW

In one form, the invention resides in an apparatus comprising a bracket having a base configured to receive and hold a first electronic element and having at least one flange extending from the base with at least one guide acting to align the bracket and first electronic element with a second electronic element. The base includes at least one fastener aligned with the at least one guide and acting to engage and hold the second electronic element.

In another form, the invention resides in a method comprising fixing a first electronic element to a bracket; aligning the bracket with a second electronic element using at least one guide that extends from the bracket and is aligned to at least one fastener located on the bracket; making an electronic connection between the first electronic element and the second electronic element; and fixing the bracket to the second electronic element with the fastener.

DESCRIPTION OF EXAMPLE EMBODIMENTS

Figure 1:
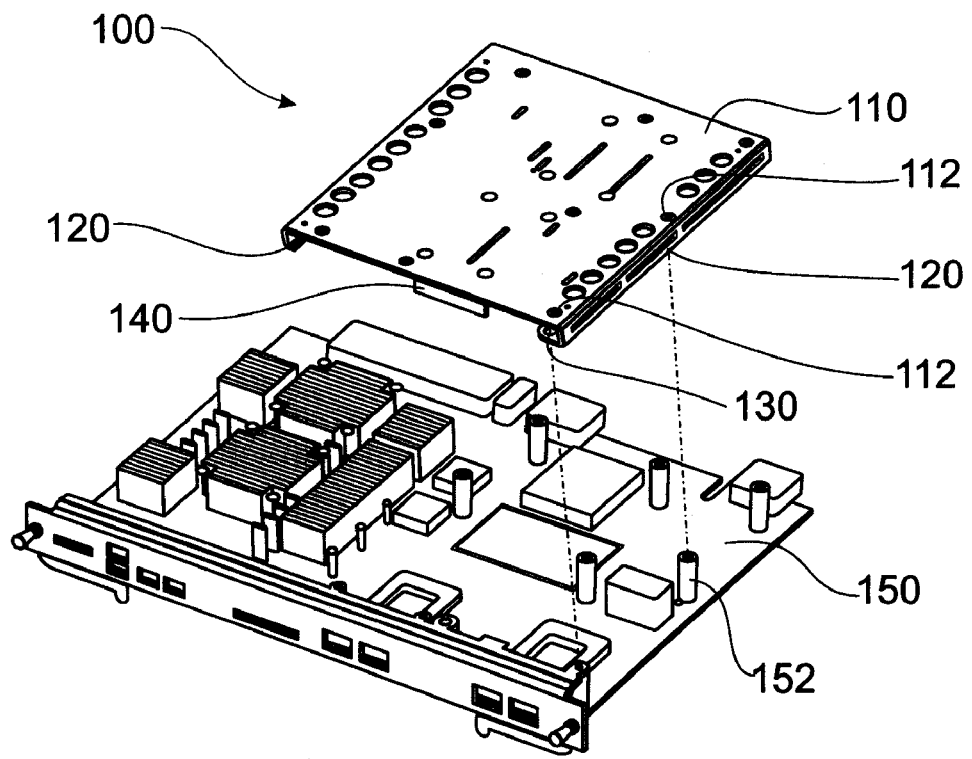
FIG. 1 illustrates an example bracket and first electronic element coupled together with an example second electronic element.

The present invention will now be described with reference to the drawings, wherein like reference numerals are used to refer to like elements throughout.

Referring to FIG. 1 there is shown a bracket 100 according to one embodiment. The bracket 100 comprises a planar base 110, two flanges 120 and two guides 130. The bracket is configured to receive and hold a first electronic element 140 which is aligned over a second electronic element 150 during assembly, as shown by the dotted lines in FIG. 1.

For the purpose of description the first electronic element 140 is a printed circuit assembly (PCA) and the second electronic element 150 is a mother board that comprises a number of electronic components familiar to persons skilled in the field. When assembled there is electrical contact between the first electronic element 140 and the second electronic element 150 by, for example, a mating connector.

The base 110 includes fasteners 112 aligned with the guides 130. The guides 130 align with guiding features (i.e. columns 152) on the second electronic element 150 to guide the first electronic element 140 into correct alignment with the second electronic element 150. When correctly aligned the fasteners 112 fasten the base 100 to the columns 152 to fix the first electronic element 140 in correct alignment with the second electronic element 150 for electronic connection between the first electronic element 140 and the second electronic element 150.

Figure 2:
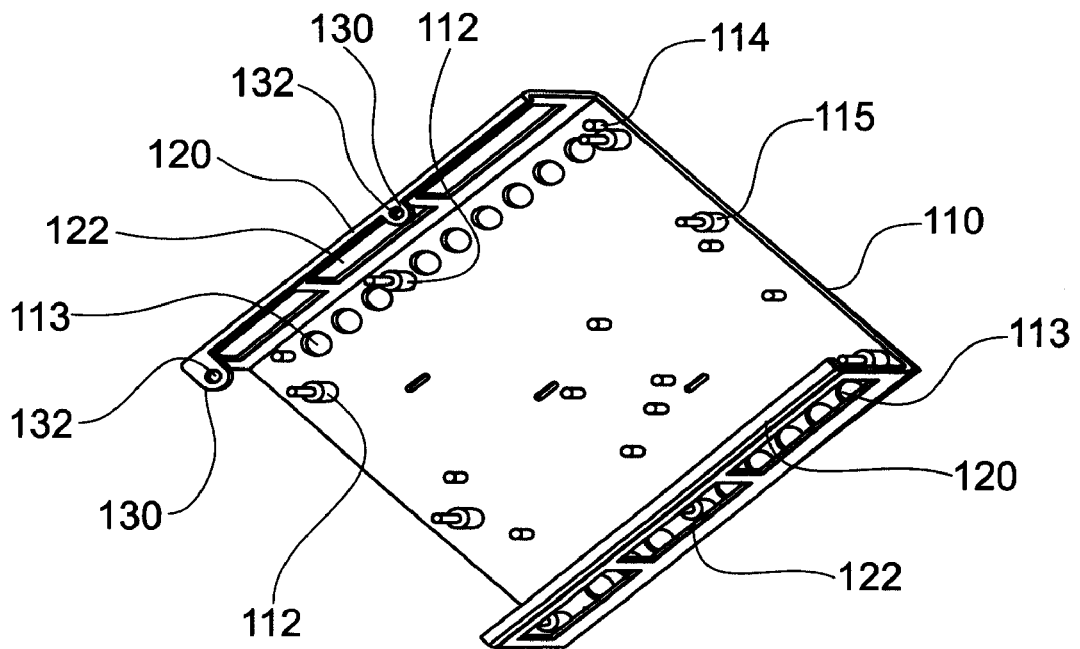
FIG. 2 illustrates the bracket of FIG. 1 without the first electronic element.

The bracket 100 is shown in greater detail in FIG. 2. Flanges 120 extend from the base 110 and include flange apertures 122 to provide ventilation. Flanges 120 provide separation of the first electronic element 140 from the second electronic element 150. Although this embodiment shows the bracket 100 comprising two flanges 120, other embodiments may comprise one, three or more flanges.

Ventilation is also provided by base apertures 113, which in the embodiment are positioned along either side of the base 110. It will be appreciated that the location of the base apertures 113 is purely a matter of design choice to provide proper ventilation.

In the embodiment the fasteners 112 are captured screws that remain in the base 110. Captured screws assist with assembly as described below. Other types of fasteners, such as clips or bolts, may also be suitable. The fasteners 112 are suitably flush mounted with the base 110. In addition a number of extra fasteners, such as 115, are provided that align with the columns 152 to fix the bracket 100 to the second electronic element 150.

Guides 130 extend from the flanges 120 and are substantially parallel to the base 110. The guides 130 include alignment holes 132, which receive columns 152 from the second electronic element 150 and assist alignment of the first electronic element 140 to the second electronic element 150. The two guides 130 and fasteners 112 are arranged such that fasteners 112 align with the columns 152 when the alignment holes 132 receive columns 152.

Stand-offs 114 secure the first electronic element 140 to the bracket 100. Stand-offs 114 provide a separation between the first electronic element 140 and the base 110 to provide ventilation. In the embodiment, the stand-offs 114 are located adjacent the four corners of the base 110.

Figure 3:
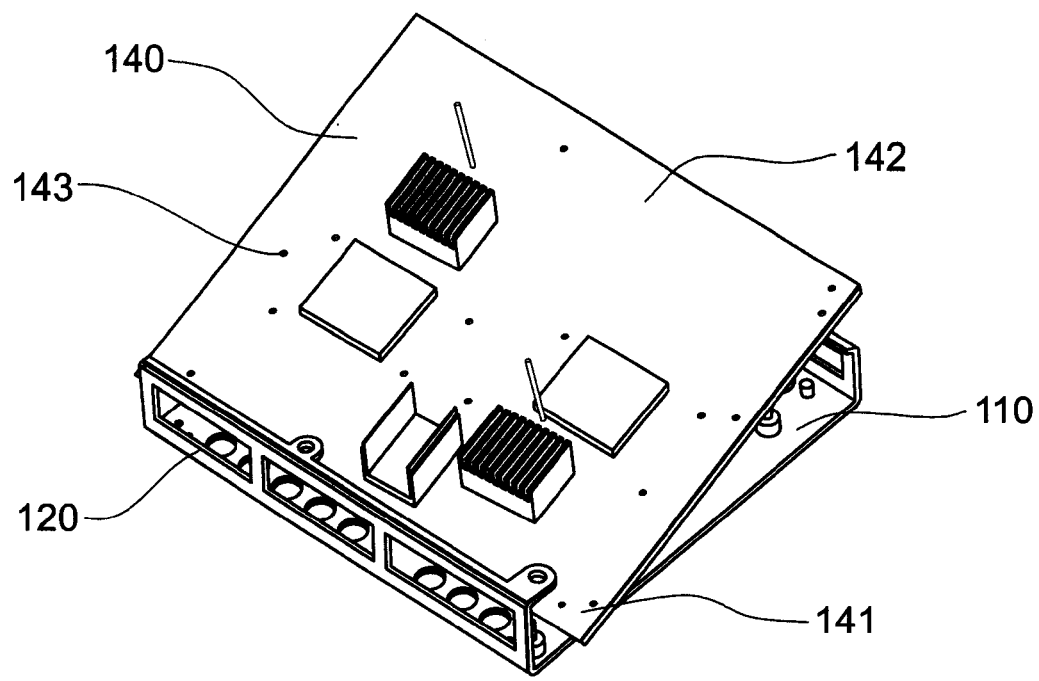
FIG. 3 illustrates the bracket of FIG. 1 receiving the first electronic element.
Figure 4:
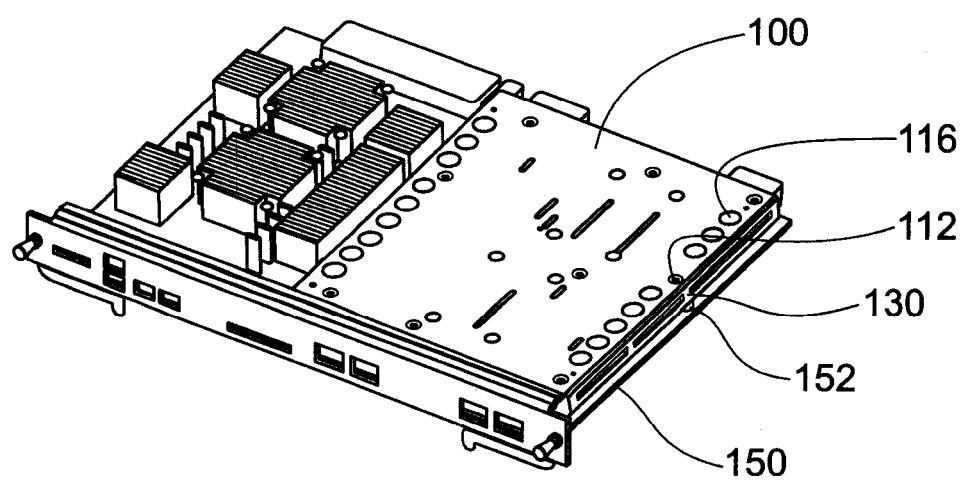
FIG. 4 illustrates the bracket of FIG. 1 coupled to the second electronic element.

Assembly of the first electronic element 140 to the bracket 100 is shown in FIG. 3. The bracket 100 receives the first electronic element 140 by abutting one edge 141 of the first electronic element 140 against the flange 120 and lowering the opposite edge 142 of the first electronic element 140 towards the base 110. The first electronic element 140 includes a number of holes 143 that allow fastening through of the stand-offs 114 and the fasteners 112. Once the first electronic element 140 is fixed to the bracket 100, the combination is aligned to second electronic element 150 so that the columns 152 of the second electronic element 150 are received by the alignment holes 132 of the guides 130 of the bracket 100, as seen earlier in FIG. 1. FIG. 4 shows the assembled first electronic element 140 and second electronic element 150 using the bracket 100.

Although the base 110 of bracket 100 is shown as basically rectangular the shape can be designed to suit a particular implementation. The base 110 may be of any shape, configuration or and size to suit the first electronic element 140 and the second electronic element 150. The bracket 100 is suitably manufactured from thin-gauge stainless steel although in other embodiments the bracket 100 may be manufactured from mild steel, aluminum, titanium or other suitable materials used in the field.

Although the present embodiment of the disclosure has been described with the bracket 100 having two guides 130 and two alignment holes 132, a person skilled in the field can appreciate that a greater the number of guides 130, alignment holes 132 and corresponding columns 152 may improve the accuracy of alignment between the first electronic element 140 and the second electronic element 150.

Embodiments of the disclosure have been described with the first electronic element 140 as a printed circuit assembly and the second electronic element 150 being a motherboard. However in other embodiments the first electronic element 140 and the second electronic element 150 can include other electronic elements such as: a printed circuit assembly; a printed circuit board; a circuit board; a motherboard; a field-replacement unit; a heat sink; a cooling device; an electronic component; or an integrated circuit.

Figure 5:
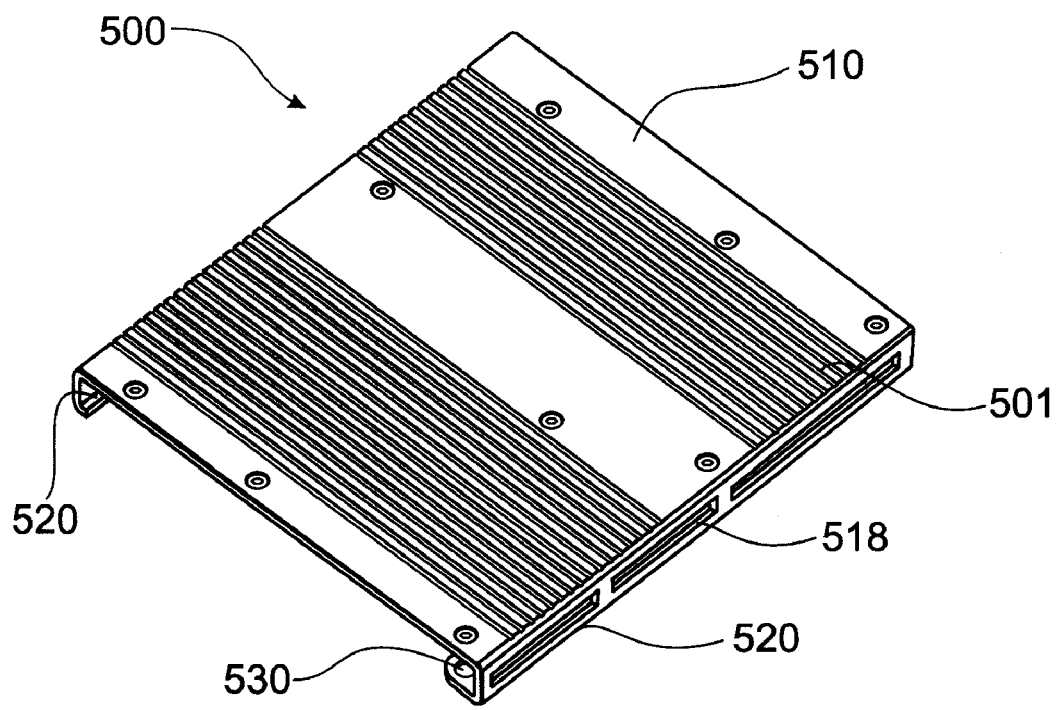
FIG. 5 illustrates another example of a bracket.

FIG. 5 shows a bracket 500 according to another embodiment of the invention. As with the embodiment of FIG. 1, the bracket 500 comprises a planar base 510, two flanges 520 and a number of guides 530. In this embodiment, the bracket 500 is manufactured from a thicker gauge of material compared to the previously described embodiment. As such, the bracket 500 includes multiple grooves 501 that transverse one side of the base 510. The grooves 501 act to dissipate heat and complement ventilation allowed by the flange apertures 518. Although this illustrated embodiment of the bracket 500 does not include base apertures other embodiments may have grooves and base apertures.

Figure 6:
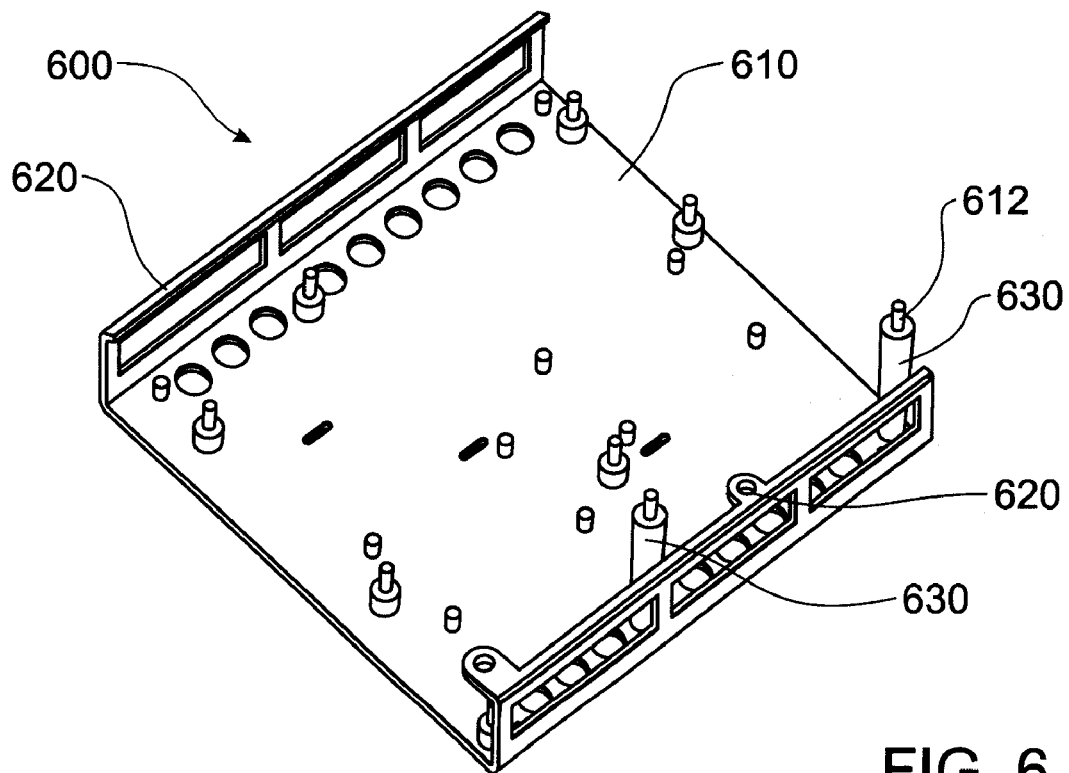
FIG. 6 illustrates a further example of a bracket.

A yet further embodiment of a bracket 600 is shown in FIG. 6. As with previous embodiments, the bracket 600 comprises a planar base 610, two flanges 620 and two guides in the form of long stand-offs 630. The first electronic element 140 is fixed to the bracket 600 in the manner described with reference to FIG. 3. The first electronic element 140 has clearance holes to allow passage of the long stand-offs 630. The long stand-offs align with matching apertures in the second electronic element 150 to align the first electronic element 140 and bracket 600 with the second electronic element 150. Fasteners 612 on the long stand-offs 630 engage and hold the second electronic element 150. A suitable fastener 612 is a bolt with a nut applied to hold the second electronic element 150.

Figure 7:
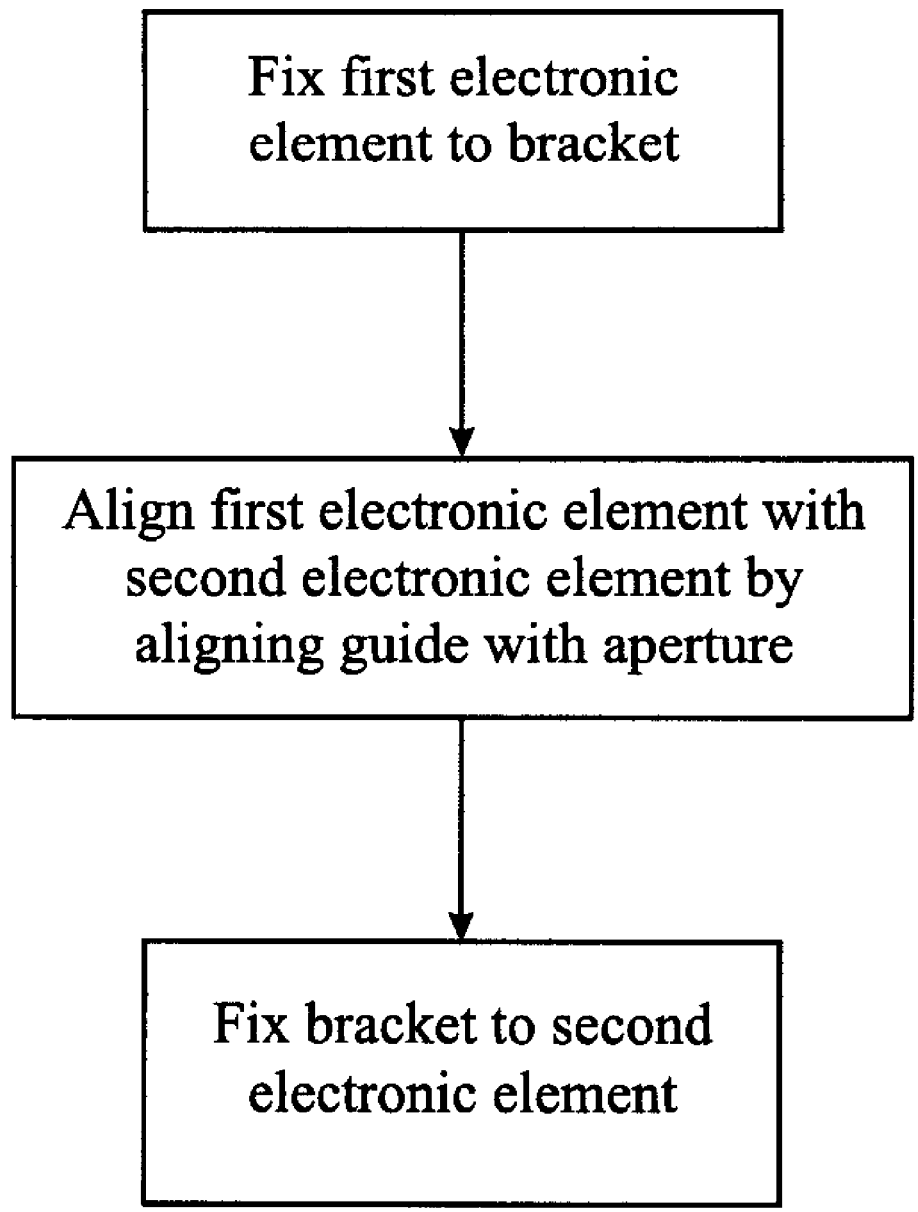
FIG. 7 is a flow chart outlining assembly steps.

FIG. 7 shows a flowchart of a method of assembly for the embodiments. The method comprises a first step of coupling the first element 140 to the bracket 100, 500, 600. In a second step the first electronic element 140 is aligned with a second electronic element 150 using at least one guide 130, 530, 630 that extends from the bracket or the second electronic element 150. Finally the bracket 100, 500, 600 is fixed to the second electronic element 150 using at least one fastener 112 located on the bracket.

The present disclosure provides a substantial contribution in the field of electronic devices. In particular, the bracket provides a relatively simple and practical tool for aligning a first electronic element and a second electronic element. For example, field-replacement units can be easily installed or uninstalled. Furthermore, there is maximum utilization of space between the first electronic element 140 and the second electronic element 150 without risking damage to electronic components and/or integrated circuits and higher manufacturing assembly yield.

Throughout the specification, the aim has been to describe the invention without limiting the invention to any one embodiment or specific collection of features. Persons skilled in the relevant art may realise variations from the specific embodiments that will nonetheless fall within the scope of the invention

The invention claimed is:

1. An apparatus comprising:
    a bracket having a base configured to receive and hold a printed circuit board;
    at least one flange extending from the base;
    at least one guide configured to align the bracket and the printed circuit board with a motherboard; and
    at least one fastener aligned with the at least one guide and configured to engage and hold the motherboard.

2. The apparatus of claim 1 wherein the at least one guide extends from the at least one flange.

3. The apparatus of claim 1 wherein the at least one guide extends substantially parallel to the base from the at least one flange.

4. The apparatus of claim 1 wherein the at least one guide includes an alignment hole configured to receive a column extending from the motherboard.

5. The apparatus of claim 1 wherein the at least one guide is an elongated stand-off configured to mate with a hole in the motherboard.

6. The apparatus of claim 1 wherein the base includes at least one stand-off that separates the printed circuit board from the base.

7. The apparatus of claim 1 wherein the bracket includes at least one aperture configured to provide ventilation.

8. The apparatus of claim 1 wherein the bracket includes at least one aperture in the base configured to provide ventilation of the printed circuit board.

9. The apparatus of claim 1 wherein the bracket includes at least one aperture in the flange configured to provide ventilation between the printed circuit board and the motherboard.

10. The apparatus of claim 1 wherein the bracket includes heat dissipating fins in the base.

11. A method comprising:
    fixing a printed circuit board to a bracket;
    aligning the bracket with a motherboard using at least one guide that extends from the bracket and is aligned to at least one fastener located on the bracket;
    making an electronic connection between the printed circuit board and the motherboard; and
    fixing the bracket to the motherboard with the fastener.

12. The method of claim 11 further including the step of the at least one guide receiving at least one column located on the motherboard.

13. The method of claim 11 wherein the printed circuit board is coupled to the bracket using at least one stand-off located on the bracket.

14. An apparatus comprising:
    a bracket having a base configured to receive and hold a printed circuit board;
    at least one flange extending from the base;
    at least one guide configured to align the bracket and the printed circuit board with a motherboard, wherein the at least one guide extends from the at least one flange and is configured to receive a column extending from the motherboard; and
    at least one fastener aligned with the at least one guide and configured to engage and hold the motherboard and so that the printed circuit board is engaged both mechanically and electrically to the motherboard.

15. The apparatus of claim 14 wherein the at least one guide includes an alignment hole that is configured to receive the column extending from the motherboard.

16. The apparatus of claim 14 wherein the at least one guide extends substantially parallel to the base from the at least one flange.

17. The apparatus of claim 14 wherein the at least one guide is a stand-off configured to mate with a hole in the motherboard.

18. The apparatus of claim 14, wherein the base includes at least one stand-off that is configured to separate the printed circuit board from the base.

19. The apparatus of claim 14, wherein the bracket includes at least one aperture configured to provide ventilation.

20. The apparatus of claim 14, wherein the bracket includes at least one aperture in the flange configured to provide ventilation between the printed circuit board and the motherboard.

* * * * *